United States Patent [19]
Tehrani et al.

[11] Patent Number: 5,733,827
[45] Date of Patent: Mar. 31, 1998

[54] METHOD OF FABRICATING SEMICONDUCTOR DEVICES WITH A PASSIVATED SURFACE

[75] Inventors: Saied N. Tehrani, Tempe; Mark Durlam, Chandler; Marino J. Martinez, Phoenix; Jenn-Hwa Huang, Gilbert; Ernie Schirmann, Phoenix, all of Ariz.

[73] Assignee: Motorola, Inc., Schaumburg, Ill.

[21] Appl. No.: 557,405

[22] Filed: Nov. 13, 1995

[51] Int. Cl.⁶ .................. H01L 21/28; H01L 21/337
[52] U.S. Cl. ........................... 438/572; 438/182
[58] Field of Search .................. 438/180, 181, 438/182, 184, 571, 573, 574, 578, 579, 572; 257/192, 275, 276, 537, 641, 649

[56] References Cited

U.S. PATENT DOCUMENTS

| | | | |
|---|---|---|---|
| 4,525,919 | 7/1985 | Fabian | 438/578 |
| 4,616,400 | 10/1986 | Macksey et al. | 29/571 |
| 4,679,311 | 7/1987 | Lakhani et al. | 29/579 |
| 5,006,478 | 4/1991 | Kobayashi et al. | 438/579 |
| 5,285,087 | 2/1994 | Narita et al. | 257/192 |
| 5,352,909 | 10/1994 | Hori | 257/192 |
| 5,436,201 | 7/1995 | Chi et al. | 437/203 |
| 5,556,797 | 9/1996 | Chi et al. | 437/405 |
| 5,610,090 | 3/1997 | Jo | 438/578 |
| 5,621,228 | 4/1997 | Ando | 257/192 |
| 5,641,977 | 6/1997 | Kanamori | 257/192 |

*Primary Examiner*—Jey Tsai
*Assistant Examiner*—Michael S. Lebentritt
*Attorney, Agent, or Firm*—Eugene A. Parsons

[57] ABSTRACT

A method of fabricating semiconductor devices with a passivated surface includes providing first cap and etch stop layers and second cap and etch stop layers with a contact layer thereon so as to define an inter-electrode surface area. A first layer and an insulating layer, which are selectively etchable relative to each other, are deposited on the contact layer and the inter-electrode surface area. The insulating layer and the first layer are individually etched to define an electrode contact area and to expose the inter-electrode surface area. Portions of the first etch stop and cap layers remaining in the contact area are selectively removed and a metal contact is formed in the contact area in abutting engagement with the insulating layer so as to seal the inter-electrode surface area.

22 Claims, 3 Drawing Sheets

METHOD OF FABRICATING SEMICONDUCTOR DEVICES WITH A PASSIVATED SURFACE

RELATED U.S. PATENT APPLICATIONS

The present patent application is an improvement on the invention described in a copending U.S. Patent Application entitled "Method of Fabricating Semiconductor Devices with a Passivated Surface Area", filed of even date herewith, assigned to the same assignee and bearing attorney docket number CR95-082.

FIELD OF THE INVENTION

The present invention pertains to the fabrication of semiconductor devices and more specifically to improved passivation of certain surfaces of the semiconductor devices during the fabrication process.

BACKGROUND OF THE INVENTION

Compound semiconductor devices, such as FETs, HBTs, lasers, etc., need a properly passivated surface between electrodes for consistent device operation, improved device characteristics, and better reliability. Achieving clean avalanche breakdown with low leakage currents is critical to device performance in RF power applications, for example. Devices that have leaky reverse characteristics or that have transients in the breakdown voltage characteristics will have lower power added efficiency and may not be suitable for high power or low voltage applications. The region adjacent and outside the gate is critical in achieving high performance RF devices. This region is normally passivated with a layer of $Si_3N_4$ in GaAs devices. The $Si_3N_4$ passivation layer contributes to charge trapping sites at the surface of the device, which induce reverse leakage current and reduce breakdown voltage.

In GaAs MESFETs, for example, the gate-drain breakdown voltage is one of the most important factors limiting the maximum output power of the MESFET. Many prior methods to increase the breakdown voltage, such as a double gate recess and increased gate-drain spacing, are often accompanied by lower RF gain and/or drain saturation current. Attempts to increase the gate-drain breakdown voltage by placing an insulator between the gate metal and the MESFET channel usually introduce undesirable interface states.

Recently, GaAs MESFETs with a low interface-state density were realized using a high-resistivity low-temperature-grown GaAs layer as the gate insulator. In a conventional gate MESFET, the high-resistivity low-temperature-grown GaAs layer is deposited and then etched to allow the deposition of source, drain and gate metal contacts. The major problem with this method is that a gap remains between the sides of the metal contacts and the high-resistivity low-temperature-grown GaAs layer, which substantially reduces the breakdown voltage of the MESFET. A typical example of such structures is disclosed in U.S. Pat. No. 5,041,393, entitled "Fabrication of GaAs Integrated Circuits" and issued Aug. 20, 1991.

In an attempt to solve this problem in the prior art, the gate metal was deposited so as to overlap the high-resistivity low-temperature-grown GaAs layer. However, the overlap gate process is difficult and complicated and requires a critical alignment and wet etching process and is not, therefore, easily manufacturable, especially for sub-micron gate dimensions.

In the above described copending U.S. Patent Application, a portion of the $Si_3N_4$ layer surrounding the gate is removed and replaced by a vacuum (or gas) so that charges, or hot electrons, cannot be driven into it. In some instances the removal of the $Si_3N_4$ layer results in damage to upper layers of the semiconductor device, which results in nonuniformity and non-reproducibility across the wafer.

It would be advantageous to have a fabrication method in which the $Si_3N_4$ layer under and around the gate is removed without damaging the underlying semiconductor device so as to provide consistent device operation, improved device characteristics, and better reliability.

It is a purpose of the present invention to provide a new and improved method of fabricating semiconductor devices with an improved passivated surface area.

It is another purpose of the present invention to provide a new and improved method of fabricating semiconductor devices with a passivated surface area while providing consistent device operation, improved device characteristics, and better reliability.

It is still another purpose of the present invention to provide a new and improved method of fabricating semiconductor devices with a passivated surface area which is relatively easy and accurate to perform.

It is a further purpose of the present invention to provide a new and improved method of fabricating semiconductor devices with a passivated surface area which substantially improves breakdown characteristics of the device.

It is a still further purpose of the present invention to provide a new and improved method of fabricating semiconductor devices in which the $Si_3N_4$ layer under and around the gate is removed without damaging the underlying semiconductor device which substantially improves the reproducibility of the characteristics of the device, such as breakdown voltage and threshold voltage control.

SUMMARY OF THE INVENTION

The above problems and others are at least partially solved and the above purposes and others are realized in a method (and device) of fabricating semiconductor devices with a passivated surface which includes providing first cap and etch stop layers and second cap and etch stop layers with a contact layer thereon so as to define an inter-electrode surface area. A first layer and an insulating layer, which are selectively etchable relative to each other, are deposited on the contact layer and the inter-electrode surface area. The insulating layer and the first layer are individually etched to define an electrode contact area and to expose the inter-electrode surface area. Portions of the first etch stop and cap layers remaining in the contact area are selectively removed and a metal contact is formed in the contact area in abutting engagement with the insulating layer so as to seal the inter-electrode surface area.

The exposed surfaces in the interelectrode area can be passivated during etching of the insulating layer (by using, for example, a fluoride etch to produce a film of gallium fluoride), subsequent to the step of etching the insulating layer, or subsequent to removing portions of the first etch stop and cap layers remaining in the contact area. In some applications it may be desirable to simply allow the vacuum (or gas), sealed in the interelectrode area by the metal contact, to act as the passivating layer.

BRIEF DESCRIPTION OF THE DRAWINGS

Referring to the drawings.

DESCRIPTION OF THE PREFERRED EMBODIMENTS

Figure 1:
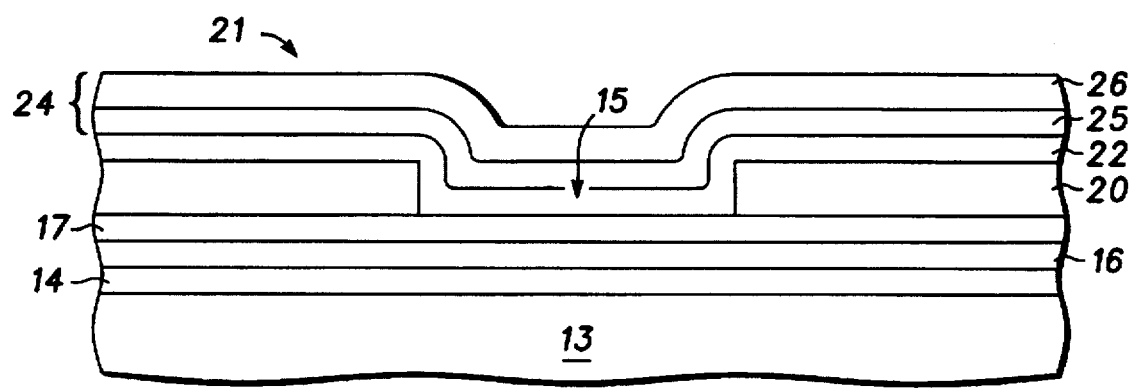
FIGS. 1 through 3 are simplified cross-sectional views of a passivation method in accordance with a copending application.
Figure 2:
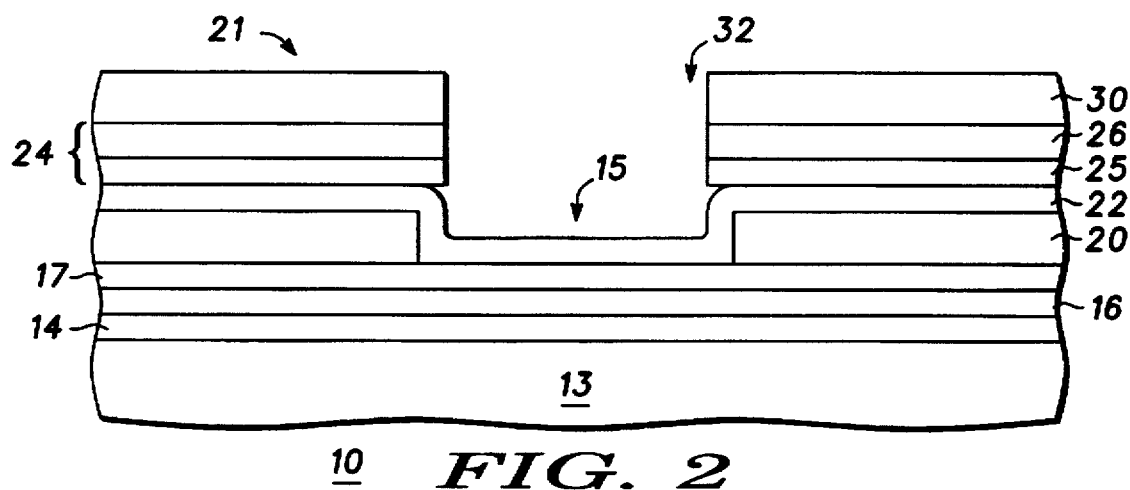
Figure 3:
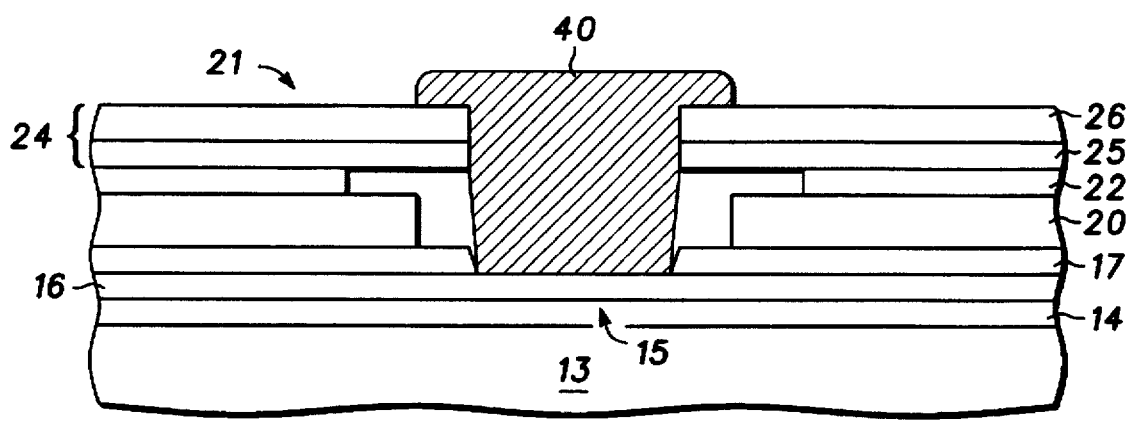

Turning now to the drawings, FIGS. 1 through 3 are simplified cross-sectional views of a passivation method in accordance with the above described copending application. Referring specifically to FIG. 1, a simplified cross-sectional view including a substrate 10 is illustrated. Substrate 10 includes one or more layers formed thereon by any convenient means, such as epitaxial growth or the like. As an example, substrate 10, in this embodiment, includes a supporting substrate 13 having a plurality of epitaxial layers 14 formed thereon. Epitaxial layers 14 are formed, for example, to provide an HFET with a source and a drain (not shown), and a gate area 15. It will be understood by those skilled in the art that other types of semiconductor devices, including various FETs, HBTs, and lasers, can be formed in, on, or as a part of a supporting substrate and are intended to be included in the definition of substrate 10.

A cap layer 16 is positioned on substrate 10 and an etch stop layer 17 is positioned on cap layer 16 by, for example, epitaxial growth. In some instances, cap layer 16 and etch stop layer 17 may also be considered as a portion of substrate 10. A contact layer 20 is generally a heavily doped epitaxial layer grown on the surface of etch stop layer 17, for purposes of making good electrical contact with the source and the drain, while defining an inter-electrode area 21 generally above gate area 15. Contact layer 20 can be a heavily doped area in the upper surface of substrate 10, or other layers thereon, but is described herein as a separate layer for ease of description and understanding. Also, contact layer 20 can be any material which can be utilized to form good ohmic contacts between the source, the drain and external metal terminals. In the present embodiment, contact layer 20 is formed of gallium arsenide (GaAs) heavily doped for N-type conduction. Also, supporting substrate 13 is formed of GaAs with epitaxial layers 14, 16, and 17 crystalographically lattice matched, so that contact layer 20 is compatible (i.e. generally crystalographically lattice matched) with substrate 10.

A first layer 22 of material is positioned on the surface of etch stop layer 17 and contact layer 20 generally as a blanket deposition, in this embodiment. While layer 22 is formed of insulating material, in this embodiment, it will be understood presently that it could be virtually any material that can be selectively etched and which is compatible with the surface of substrate 10 (etch stop layer 17 and contact layer 20). In this specific embodiment, layer 22 is formed of silicon nitride (SIN).

An insulating layer 24 is positioned in overlying relationship on layer 22 by any convenient means, such as a blanket deposition. As will be seen presently, layer 24 is in physical contact with various external metal terminals and, therefore, is preferably formed of some convenient insulating material. Also, layer 24 may be the final covering which is utilized to hermetically seal the electronic device or circuit and, therefore, should be sufficiently thick to not only withstand and protect the device from subsequent fabrication operations (e.g. etching, metal deposition, etc.) but should also provide a hermetic seal. Further, insulating layer 24 should be selectively etchable. To this end, insulating layer 24 includes a first sub-layer 25 of insulating material on the surface of layer 22 and a thicker sub-layer 26 on sub-layer 25.

In this specific embodiment, sub-layer 25 is formed of aluminum nitride (AlN), and sub-layer 26 is silicon oxide (SiO$_2$). The AlN of sub-layer 25 operates as an etch stop for the SiO$_2$ of sub-layer 26 so that etching can be performed quickly and easily. Also, there is sufficient etch selectivity between the AlN of sub-layer 25 and the SiN of layer 22 so that sub-layer 25 can be quickly and easily etched with a minimum effect on layer 22. While the dielectric trilayer, SiO$_2$/AlN/SiN, is used in the present specific example, it will be understood by those skilled in the art that other combinations of materials can be provided which will perform the described functions.

Referring now to FIG. 2, a patterned layer 30 of material is positioned on the surface of insulating layer 24 so as to define an electrode contact area on the surface of insulating layer 24. In this specific example patterned layer 30 is photoresist which is deposited on insulating layer 24 in any of the well known methods. Further, patterned layer 30 has an opening 32 therethrough which defines the electrode contact area on the surface of insulating layer 24. Various techniques for patterning layer 30 to form opening 32 are known in the art and will not be elaborated upon in this disclosure.

Utilizing patterned layer 30 as an etch mask, layers 26 and 25 are etched down to layer 22, as illustrated in FIG. 2. In this etching step, the AlN of sub-layer 25 operates as an etch stop to ensure that the etching process stops at sub-layer 25, which simplifies the process and reduces the possibility of incidental damage. A second etch process is then utilized, with layer 26 operating as an etch mask, to form an opening through sub-layer 25, as illustrated in FIG. 2. Since sub-layer 25 and layer 22 are formed of material with etch selectivity, layer 22 operates as an etch stop for the etching of sub-layer 25 to ensure that the etching process stops at layer 22, which again simplifies the process and reduces the possibility of incidental damage. The opening through sub-layer 25 defines the electrode contact area on layer 22.

Referring now to FIG. 3, another etch process is performed to etch layer 22 through the opening formed in sub-layer 25. Layer 22 is etched under layer 25 with sufficient undercut to expose inter-electrode area 21. Generally, inter-electrode area 21 includes the electrode contact area and an active channel region which surrounds the electrode contact area. The undercut may be sufficient to expose a portion of contact layer 20, if desired, or may stop at the edge of contact layer 20. In one embodiment, a passivating film is formed at the same time that layer 22 is etched. These steps are performed simultaneously by utilizing specific etchants, such as NF$_3$ or XeF$_6$ dry etches. The fluorine of the etchant reacts with the material of substrate 10, for example gallium, to form gallium fluoride (GaF$_3$). One problem is that unless great care is used in the etching step, layer 17 and some of cap layer 16 are etched, or at least damaged. Depending upon the amount of material etched and/or damaged the efficiency, life, and uniformity of the semiconductor device can be substantially reduced.

Figure 4:
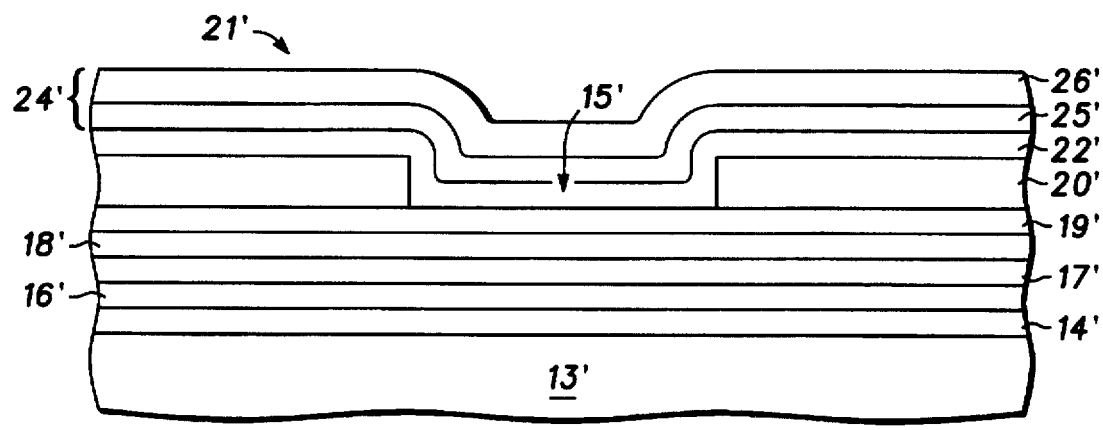
FIGS. 4 through 7 illustrate various steps of a method in accordance with the present invention.

Referring now to FIGS. 4–7, various steps of a method of fabricating semiconductor devices with improved passivation in accordance with the present invention are illustrated. In these figures similar components are designated with similar numbers and all of the numbers have a prime added to indicate the different embodiment. Referring specifically to FIG. 4, a simplified cross-sectional view including a substrate 10' is illustrated. Substrate 10' includes one or more layers formed thereon by any convenient means, such as epitaxial growth or the like. As an example, substrate 10', in this embodiment, includes a supporting substrate 13' having a plurality of epitaxial layers 14' formed thereon. Epitaxial layers 14' are formed, for example, to provide an HFET with a source and a drain (not shown), and a gate area. It will be understood by those skilled in the art that other types of semiconductor devices, including various FETs, HBTs, and lasers, can be formed in, on, or as a part of a supporting substrate and are intended to be included in the definition of substrate 10'. To this end the contact area in the device is simply referred to as electrode contact area 15'.

A first cap layer 16' is positioned on substrate 10' and a first etch stop layer 17' is positioned on first cap layer 16' by, for example, epitaxial growth. In some instances, cap layer 16' and etch stop layer 17' may also be considered as a portion of substrate 10'. A second cap layer 18' is positioned on first etch stop layer 17' and a second etch stop layer 19' is positioned on second cap layer 18' by, for example, epitaxial growth. A contact layer 20' is generally a heavily doped epitaxial layer grown on the surface of second etch stop layer 19', for purposes of making good electrical contact with the source and the drain, while defining an interelectrode area 21' generally above electrode contact area 15'. Contact layer 20' can be a heavily doped area in the upper surface of substrate 10' (or the various layers included therein), or other layers thereon, but is described herein as a separate layer for ease of description and understanding. Also, contact layer 20' can be any material which can be utilized to form good ohmic contacts between the source, the drain and external metal terminals.

In the present embodiment, contact layer 20' is formed of gallium arsenide (GaAs) heavily doped for N-type conduction. Also, supporting substrate 13' is formed of GaAs with epitaxial layers 14', 16', 17', 18' and 19' crystalographically lattice matched, so that contact layer 20' is compatible (i.e. generally crystalographically lattice matched) with substrate 10'. Layer 16' is, in this embodiment GaAs, layer 17' is AlAs, layer 18' is GaAs, and layer 19' is AlAs. It will of course be understood by those skilled in the art that terms used in this disclosure, such as "AlAs" and "GaAs" are intend to include any alloys of the material as, for example, an alloy AlGaAs of AlAs.

A first layer 22' of material is positioned on the surface of second etch stop layer 19' and contact layer 20' generally as a blanket deposition, in this embodiment. While layer 22' is formed of insulating material, in this embodiment, it will be understood presently that it could be virtually any material having selectivity relative to layer 25' and which is compatible with the surface of substrate 10'. In this specific embodiment, layer 22' is formed of silicon nitride (SiN).

An insulating layer 24' is positioned in overlying relationship on layer 22' by any convenient means, such as a blanket deposition. As will be seen presently, layer 24' is in physical contact with various external metal terminals and, therefore, is preferably formed of some convenient insulating material. Also, layer 24' may be the final covering which is utilized to hermetically seal the electronic device or circuit and, therefore, should be sufficiently thick to not only withstand and protect the device from subsequent fabrication operations (e.g. etching, metal deposition, etc.) but should also provide a hermetic seal. Further, insulating layer 24' should be selectively etchable. To this end, insulating layer 24' includes a first sub-layer 25' of insulating material on the surface of layer 22' and a thicker sub-layer 26' on sub-layer 25'.

In this specific embodiment, sub-layer 25' is formed of aluminum nitride (AlN), and sub-layer 26' is silicon oxide ($SiO_2$). The AlN of sub-layer 25' operates as an etch stop for the $SiO_2$ of sub-layer 26' so that etching can be performed quickly and easily. Also, there is sufficient etch selectivity between the AlN of sub-layer 25' and the SiN of layer 22' so that sub-layer 25' can be quickly and easily etched with a minimum effect on layer 22'. While the dielectric trilayer, $SiO_2$/AlN/SiN, is used in the present specific example, it will be understood by those skilled in the art that other combinations of materials can be provided which will perform the described functions.

Figure 5:
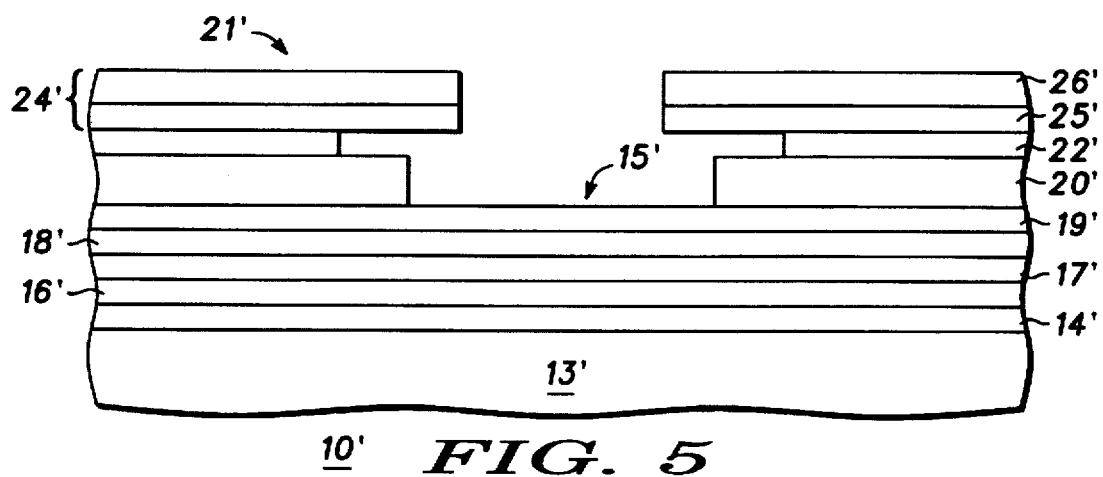

Referring now to FIG. 5, a patterned layer of material (not shown) is positioned on the surface of insulating layer 24' so as to define electrode contact area 15' on the surface of insulating layer 24'. In this specific example the patterned layer is photoresist which is deposited on insulating layer 24' in any of the well known methods. Further, the patterned layer has an opening therethrough which defines electrode contact area 15' on the surface of insulating layer 24'. Various techniques for patterning the layer to form the opening are known in the art and will not be elaborated upon in this disclosure.

Utilizing the patterned layer as an etch mask, layers 26' and 25' are etched down to layer 22', as illustrated in FIG. 5. In a first etching step, the AlN of sub-layer 25' operates as an etch stop to ensure that the etching process stops at sub-layer 25', which simplifies the process and reduces the possibility of incidental damage. A second etch process is then utilized, with layer 26' operating as an etch mask, to form an opening through sub-layer 25', as illustrated in FIG. 5. Since sub-layer 25' and layer 22' are formed of material with etch selectivity, layer 22' operates as an etch stop for the etching of sub-layer 25' to ensure that the etching process stops at layer 22', which again simplifies the process and reduces the possibility of incidental damage. The opening through sub-layer 25' defines electrode contact area 15' on layer 22'.

Figure 6:
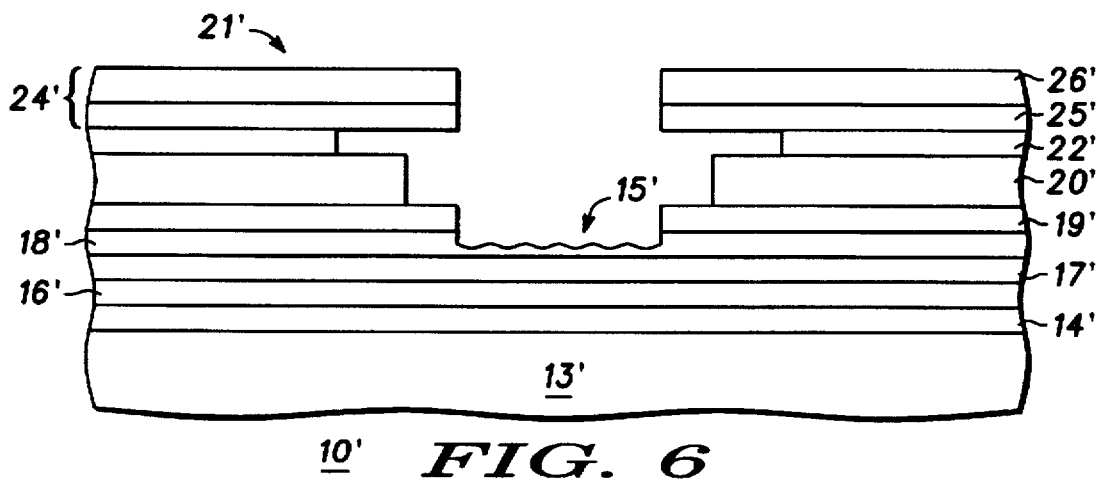

Referring now to FIG. 6, another etch process is performed to etch layer 22' through the opening formed in sub-layer 25'. Layer 22' is etched under layer 25' with sufficient undercut to expose inter-electrode area 21'. Generally, inter-electrode area 21' includes electrode contact area 15' and an active channel region which surrounds electrode contact area 15'. The undercut may be sufficient to expose a portion of contact layer 20', if desired, or may stop at the edge of contact layer 20'. As can be seen in FIG. 6, second etch stop layer 19' and second cap layer 18' are partially etched during the etching of layer 22'. The damage to layers 19' and 18' would seriously effect the operation and efficiency of the semiconductor device if not rectified.

To solve this problem, the remaining portions of second cap layer 18' are selectively etched, using first etch stop layer 17' to stop or slow the etching. Thus, the damaged first etch stop layer 19' and first cap layer 18' are completely removed from electrode contact area 15' while retaining undamaged second cap layer 16'. Because second cap layer 16' is undamaged by the various etch steps, the semiconductor device operates much more efficiently and features like operating characteristics and longevity are substantially improved.

In some applications additional treatment of the surface of inter-electrode area 21' may not be required and simply providing a vacuum chamber 34' (or a gas filled chamber) adjacent the surface of inter-electrode area 21' is sufficient passivation. Vacuum (or gas) chamber 34' surrounding the gate is generally sufficient passivation so that charges, or hot electrons, cannot be driven into it to cause current leakage and/or breakdown. Chamber 34' is sealed by a metallization step, which will be explained in detail presently.

In another embodiment, a passivating film 35' is formed at the same time that layer 22' is etched. These steps are performed simultaneously by utilizing specific etchants, such as $NF_3$ or $XeF_6$ dry etches. The fluorine of the etchant reacts with some or all of the materials of the various layers 17', 18', 19' and 20', for example gallium alloys, to form gallium fluoride ($GaF_3$).

In another embodiment, once layer 22' is etched to the desired undercut, the surface of inter-electrode area 21' can be treated to form a thin film 35' of passivating material. The passivating treatment is any fluid material that reacts with the material of inter-electrode area 21' to form passivating film 35'. Typically, the fluid material is a sulfide, fluoride, or oxide in gaseous form which reacts with the various materials to form a passivating film or surface, some specific examples of which are gallium sulfide (GAS), gallium fluoride ($GaF_3$), and ammonium sulfide (($NH_4)_2S$).

Passivating film 35' and/or chamber 34' provide consistent device operation, improved device characteristics, and better reliability than any of the previously used passivating dielectric layers which are deposited on the surface of the substrate so as to surround the electrode area. However, passivating film 35' generally is not stable against temperature and chamber 34' must be sealed, to which end subsequent processing steps are provided. Therefore, the present method not only forms, but preserves, passivating film 35' and/or chamber 34' so as to take advantage of the improved device characteristics.

Figure 7:
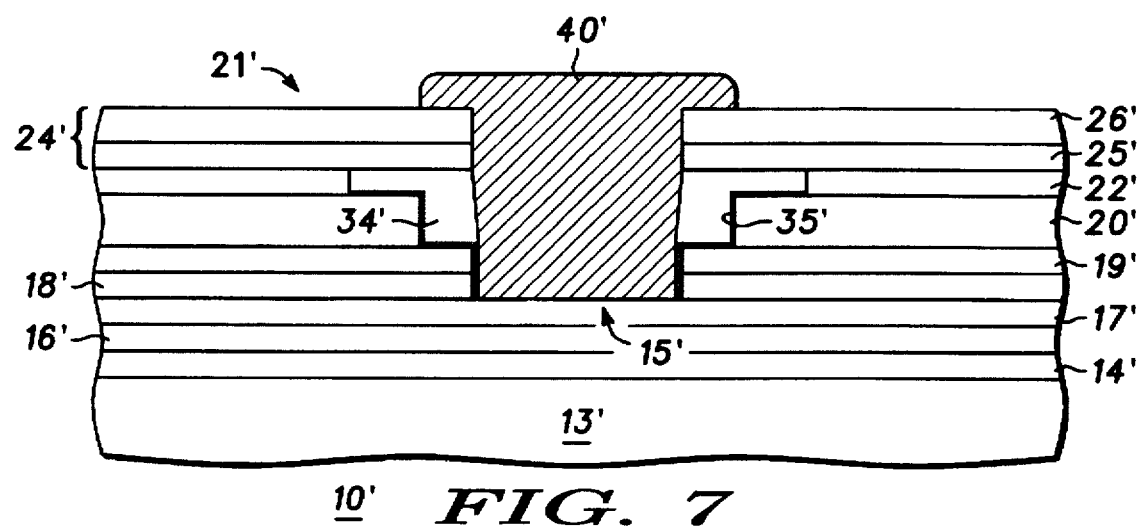

Referring now to FIG. 7, the patterned layer is removed from the device (or not removed, depending upon the metallization process used) and electrode metal 40' is deposited on electrode contact area 15' and within the opening through insulating layer 24' so as to abuttingly engage insulating layer 24' and seal inter-electrode surface area 21' and chamber 34'. In the present embodiment, for example, electrode contact area 15' is a gate contact area for an HFET and interelectrode area 21' is positioned between the source and the drain, including the active channel region. Also, electrode metal 40' is gate metal and may be deposited utilizing any of the well known techniques, including metal evaporation, photo-patterning, and etch; or photo-patterning, metal evaporation and lift-off. In the latter procedure, the photo-patterning generally utilizes the patterned layer, which is already available.

The photoresist process and evaporation techniques (e.g. angle evaporation, etc.) may be optimized to ensure that metal 40' completely seals the opening through insulating layer 24'. Generally, the various processes are performed in a vacuum and by sealing the opening through insulating layer 24', passivating film 35' and/or chamber 34' are protected from the environment and from subsequent process steps. Additional process steps, such as forming external metal contacts for the source and drain, can now be performed without adversely effecting passivating film 35' and/or chamber 34'.

Thus, a new and improved method of fabricating semiconductor devices with a passivated surface area is disclosed. The new and improved method includes the formation of a passivating film and/or a surrounding chamber which provides consistent device operation, improved device characteristics, and better reliability. Specifically, the new and improved method of fabricating semiconductor devices with a passivated surface area substantially improves breakdown characteristics of the device (e.g. gate-to-drain breakdown). Also, the new and improved method of fabricating semiconductor devices with a passivated surface area is relatively easy and accurate to perform.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating semiconductor devices with a passivated surface, the method comprising the steps of:

providing a substrate having a semiconductor device cap layer of material thereon and a first etch stop layer positioned on the cap layer;

positioning a second cap layer on the first etch stop layer and a second etch stop layer on the second cap layer and positioning a contact layer of material on a surface of the second etch stop layer so as to define an inter-electrode surface area for a semiconductor device;

positioning a first layer of material on the contact layer and the inter-electrode surface area;

positioning an insulating layer of material on the first layer in overlying relationship to the interelectrode surface area, the insulating layer being selectively etchable relative to the first layer;

positioning a patterned layer of material on the insulating layer, the patterned layer having an opening therethrough defining an electrode contact area on the insulating layer;

selectively etching the insulating layer in the electrode contact area to define the electrode contact area on the first layer;

etching the first layer in the electrode contact area and the inter-electrode area to expose the inter-electrode surface area;

selectively etching portions of the first cap layer and first etch stop layer remaining in the electrode contact area; and positioning a metal contact in the electrode contact area in abutting engagement with the insulating layer so as to seal the inter-electrode surface area.

2. A method of fabricating semiconductor devices with a passivated surface as claimed in claim 1 wherein the step of etching the first layer in the electrode contact area and the inter-electrode area includes passivating the exposed inter-electrode surface area.

3. A method of fabricating semiconductor devices with a passivated surface as claimed in claim 1 wherein the step of providing the substrate having the semiconductor device cap layer of material thereon and the first etch stop layer includes providing a gallium arsenide material system substrate with a gallium arsenide first cap layer and an aluminum arsenide first etch stop layer.

4. A method of fabricating semiconductor devices with a passivated surface as claimed in claim 3 wherein the step of positioning the second cap layer on the first etch stop layer and the second etch stop layer on the second cap layer includes depositing a gallium arsenide second cap layer on the first etch stop layer and depositing an aluminum arsenide second etch stop layer on the second cap layer.

5. A method of fabricating semiconductor devices with a passivated surface as claimed in claim 1 wherein the step of providing the substrate includes providing a supporting substrate including a plurality of epitaxial layers grown on a surface thereof with the cap layer overlying the plurality of epitaxial layers and the contact layer includes a heavily doped epitaxial layer grown on the surface of the second etch stop layer.

6. A method of fabricating semiconductor devices with a passivated surface as claimed in claim 1 wherein the step of positioning the first layer of material on the contact layer and the inter-electrode area includes depositing a layer of silicon nitride.

7. A method of fabricating semiconductor devices with a passivated surface as claimed in claim 6 wherein the step of positioning the insulating layer of material on the first layer includes depositing a layer of aluminum nitride.

8. A method of fabricating semiconductor devices with a passivated surface as claimed in claim 7 wherein the step of positioning the insulating layer of material on the first layer includes a step of forming the insulating layer of two different sub-layers of material.

9. A method of fabricating semiconductor devices with a passivated surface as claimed in claim 8 wherein the step of forming the insulating layer of two different sub-layers of material includes depositing a sub-layer of aluminum nitride on the layer of silicon nitride and depositing a sub-layer of silicon oxide on the layer of aluminum nitride.

10. A method of fabricating semiconductor devices with a passivated surface as claimed in claim 1 wherein the step of positioning the patterned layer of material on the insulating layer includes forming a layer of photoresist material on the insulating layer.

11. A method of fabricating semiconductor devices with a passivated surface as claimed in claim 2 wherein the step of etching the first layer and passivating the exposed inter-electrode surface area includes utilizing an etchant which reacts with the exposed surface of the inter-electrode area to form a passivation film.

12. A method of fabricating semiconductor devices with a passivated surface as claimed in claim 2 wherein the step of etching the first layer and passivating the exposed inter-electrode surface area includes the sub-step of etching the first layer in the electrode contact area and the inter-electrode area to expose the inter-electrode surface area and the separate sub-step of passivating the exposed inter-electrode surface area subsequent to the sub-step of etching the first layer.

13. A method of fabricating semiconductor devices with a passivated surface as claimed in claim 12 wherein the sub-step of passivating the exposed inter-electrode surface area includes treating the inter-electrode surface area with a fluid including one of an oxide, a fluoride or a nitride.

14. A method of fabricating semiconductor devices with a passivated surface as claimed in claim 1 including, subsequent to the step of positioning a metal contact in the electrode contact area, the step of forming additional external metal contacts for additional electrodes.

15. A method of fabricating semiconductor devices with a passivated surface, the method comprising the steps of:

providing a substrate, including a supporting substrate of gallium arsenide with a plurality of epitaxial layers in the gallium arsenide material system grown on a surface of the supporting substrate so as to form a semiconductor device, having a semiconductor device cap layer of gallium arsenide thereon and a first etch stop layer positioned on the cap layer;

positioning a second cap layer of gallium arsenide on the first etch stop layer and a second etch stop layer on the second cap layer and positioning a contact layer of heavily doped epitaxial material on a surface of the second etch stop layer so as to define an inter-electrode surface area for the semiconductor device;

positioning a silicon nitride layer on the contact layer and the inter-electrode surface area;

positioning an insulating layer on the silicon nitride layer in overlying relationship to the inter-electrode layer, the insulating layer including a sub-layer of aluminum nitride positioned on the layer of silicon nitride and a sub-layer of silicon oxide positioned on the sub-layer of aluminum nitride, the insulating layer being selectively etchable relative to the silicon nitride layer;

positioning a patterned layer of material on the insulating layer, the patterned layer having an opening therethrough defining an electrode contact area on the insulating layer;

selectively etching the insulating layer in the electrode contact area to define the electrode contact area on the silicon nitride layer;

etching the silicon nitride layer in the electrode contact area and the inter-electrode area to expose the inter-electrode surface area;

selectively etching portions of the first cap layer and first etch stop layer remaining in the electrode contact area using the second etch stop layer as an etch stop; and positioning a metal contact in the electrode contact area in abutting engagement with the insulating layer so as to seal the inter-electrode surface area.

16. A method of fabricating semiconductor devices with a passivated surface as claimed in claim 15 wherein the step of etching the silicon nitride layer in the electrode contact area and the inter-electrode area includes passivating the exposed inter-electrode surface area.

17. A method of fabricating semiconductor devices with a passivated surface as claimed in claim 15 wherein the step of positioning the patterned layer of material on the insulating layer includes forming a layer of photoresist material on the insulating layer.

18. A method of fabricating semiconductor devices with a passivated surface as claimed in claim 16 wherein the step of etching the silicon nitride layer and passivating the exposed inter-electrode surface area includes utilizing an etchant which reacts with the exposed surface of the inter-electrode area to form a passivation film.

19. A method of fabricating semiconductor devices with a passivated surface as claimed in claim 18 wherein the step of utilizing an etchant which reacts with the exposed surface of the inter-electrode area to form the passivation film includes utilizing one of $NF_3$ and $XeF_6$ dry etch.

20. A method of fabricating semiconductor devices with a passivated surface as claimed in claim 16 wherein the step of etching the silicon nitride layer and passivating the exposed inter-electrode surface area includes the sub-step of etching the silicon nitride layer in the electrode contact area and the inter-electrode area to expose the inter-electrode surface area and the separate sub-step of passivating the exposed inter-electrode surface area subsequent to the sub-step of selectively etching portions of the first cap layer and first etch stop layer.

21. A method of fabricating semiconductor devices with a passivated surface as claimed in claim 20 wherein the sub-step of passivating the exposed inter-electrode surface area includes treating the inter-electrode surface area with a fluid including one of an oxide, a fluoride or a nitride.

22. A method of fabricating semiconductor devices with a passivated surface as claimed in claim 15 including, subsequent to the step of positioning a metal contact in the electrode contact area, the step of forming additional external metal contacts for additional electrodes.

* * * * *